(12) United States Patent
Mishima

(10) Patent No.: US 10,529,953 B2
(45) Date of Patent: Jan. 7, 2020

(54) ORGANIC ELECTROLUMINESCENT ELEMENT, ORGANIC ELECTROLUMINESCENT UNIT, AND ELECTRONIC APPARATUS

(71) Applicant: JOLED INC., Tokyo (JP)

(72) Inventor: Kosuke Mishima, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/143,475

(22) Filed: Sep. 27, 2018

(65) Prior Publication Data

US 2019/0131577 A1 May 2, 2019

(30) Foreign Application Priority Data

Oct. 31, 2017 (JP) .................................. 2017-210611
Jul. 31, 2018 (JP) .................................. 2018-143540

(51) Int. Cl.
| | |
|---|---|
| *H01L 29/08* | (2006.01) |
| *H01L 35/24* | (2006.01) |
| *H01L 51/00* | (2006.01) |
| *H01L 51/52* | (2006.01) |
| *H01L 51/50* | (2006.01) |
| *H01L 27/32* | (2006.01) |

(52) U.S. Cl.
CPC ...... *H01L 51/5271* (2013.01); *H01L 27/3246* (2013.01); *H01L 51/5012* (2013.01); *H01L 51/5056* (2013.01); *H01L 51/5072* (2013.01); *H01L 51/5092* (2013.01); *H01L 51/5218* (2013.01); *H01L 51/5221* (2013.01); *H01L 51/5265* (2013.01); *H01L 27/3276* (2013.01); *H01L 2251/301* (2013.01)

(58) Field of Classification Search
USPC ..... 257/40, 99, E33.059, E21.503, 642–643; 438/29, 69, 82, 99
See application file for complete search history.

(56) References Cited

U.S. PATENT DOCUMENTS

| | | | |
|---|---|---|---|
| 2005/0233166 A1 | 10/2005 | Ricks et al. | |
| 2012/0112628 A1* | 5/2012 | Yoon | H01L 51/5231 313/504 |
| 2016/0155787 A1* | 6/2016 | Lee | H01L 51/5262 257/72 |
| 2016/0164039 A1* | 6/2016 | Im | H01L 51/0058 257/40 |
| 2017/0352823 A1* | 12/2017 | Kim | H01L 51/0089 |

FOREIGN PATENT DOCUMENTS

JP 2007-533157 A 11/2007

\* cited by examiner

*Primary Examiner* — Niki H Nguyen
(74) *Attorney, Agent, or Firm* — Hauptman Ham, LLP

(57) ABSTRACT

An organic electroluminescent element according to one embodiment of the disclosure includes a first reflective layer, a second reflective layer, an organic light-emitting layer, a silver electrode layer, and an ytterbium electron injection layer. The organic light-emitting layer is provided between the first reflective layer and the second reflective layer, and emits monochromatic light. The silver electrode layer is provided between the organic light-emitting layer and the second reflective layer. The ytterbium electron injection layer is in contact with the silver electrode layer on side of the organic light-emitting layer.

15 Claims, 12 Drawing Sheets

| | MODIFICATION EXAMPLE A STRUCTURE OF Yb, Ag, AND Yb (INCLUDING PROTECTIVE LAYER 28) | WORKING EXAMPLE STRUCTURE OF Yb AND Ag (WITHOUT PROTECTIVE LAYER 28) | COMPARATIVE EXAMPLE STRUCTURE OF Ag (WITHOUT ELECTRON INJECTION LAYER 16) |
|---|---|---|---|
| CATHODE 17 (Ag LAYER 2 nm) | 364.6 Ω/sq | >10 MΩ/sq | >10 MΩ/sq |
| CATHODE 17 (Ag LAYER 5 nm) | 26.5 Ω/sq | 23.9 Ω/sq | >10 MΩ/sq |

ORGANIC ELECTROLUMINESCENT ELEMENT, ORGANIC ELECTROLUMINESCENT UNIT, AND ELECTRONIC APPARATUS

CROSS REFERENCE TO RELATED APPLICATIONS

This application claims the benefit of Japanese Priority Patent Application Nos. 2017-210611 filed on Oct. 31, 2017 and 2018-143540 filed on Jul. 31, 2018, the entire contents of each of which are incorporated herein by reference.

BACKGROUND

The disclosure relates to an organic electroluminescent element, an organic electroluminescent unit, and an electronic apparatus.

A variety of organic electroluminescent units, such as organic electroluminescent displays, including organic electroluminescent elements have been proposed. Reference is made to Japanese Unexamined Patent Application Publication (Published Japanese Translation of PCT Application) No. JP2007-533157, for example.

SUMMARY

An organic electroluminescent unit has been requested to improve device characteristics without impairing current-carrying stability of an organic electroluminescent element.

It is desirable to provide an organic electroluminescent element, an organic electroluminescent unit, and an electronic apparatus that make it possible to improve device characteristics without impairing current-carrying stability.

An organic electroluminescent element according to one embodiment of the disclosure includes a first reflective layer, a second reflective layer, an organic light-emitting layer, a silver electrode layer, and an ytterbium electron injection layer. The organic light-emitting layer is provided between the first reflective layer and the second reflective layer, and emits monochromatic light. The silver electrode layer is provided between the organic light-emitting layer and the second reflective layer. The ytterbium electron injection layer is in contact with the silver electrode layer on side of the organic light-emitting layer.

An organic electroluminescent element according to one embodiment of the disclosure includes a first reflective layer, a second reflective layer, an organic light-emitting layer, an electrode layer, a film thickness adjusting layer, and a wiring layer. The organic light-emitting layer is provided between the first reflective layer and the second reflective layer, and emits monochromatic light. The electrode layer is provided between the organic light-emitting layer and the second reflective layer, and has a film thickness smaller than a film thickness of the second reflective layer. The film thickness adjusting layer is provided between the electrode layer and the second reflective layer, and has a resistance higher than a resistance of the electrode layer. The wiring layer supplies an electric current between the first reflective layer and the electrode layer.

An organic electroluminescent unit according to an embodiment of the disclosure includes a plurality of organic electroluminescent elements. One or more of the organic electroluminescent elements include a first reflective layer, a second reflective layer, an organic light-emitting layer, a silver electrode layer, and an ytterbium electron injection layer. The organic light-emitting layer is provided between the first reflective layer and the second reflective layer, and emits monochromatic light. The silver electrode layer is provided between the organic light-emitting layer and the second reflective layer. The ytterbium electron injection layer is in contact with the silver electrode layer on side of the organic light-emitting layer.

An organic electroluminescent unit according to an embodiment of the disclosure includes a plurality of organic electroluminescent elements. One or more of the organic electroluminescent elements include a first reflective layer, a second reflective layer, an organic light-emitting layer, an electrode layer, a film thickness adjusting layer, and a wiring layer. The organic light-emitting layer is provided between the first reflective layer and the second reflective layer, and emits monochromatic light. The electrode layer is provided between the organic light-emitting layer and the second reflective layer, and has a film thickness smaller than a film thickness of the second reflective layer. The film thickness adjusting layer is provided between the electrode layer and the second reflective layer, and has a resistance higher than a resistance of the electrode layer. The wiring layer supplies an electric current between the first reflective layer and the electrode layer.

An electronic apparatus according to an embodiment of the disclosure includes an organic electroluminescent unit. The organic electroluminescent unit includes a plurality of organic electroluminescent elements. One or more of the organic electroluminescent elements include a first reflective layer, a second reflective layer, an organic light-emitting layer, a silver electrode layer, and an ytterbium electron injection layer. The organic light-emitting layer is provided between the first reflective layer and the second reflective layer, and emits monochromatic light. The silver electrode layer is provided between the organic light-emitting layer and the second reflective layer. The ytterbium electron injection layer is in contact with the silver electrode layer on side of the organic light-emitting layer.

An electronic apparatus according to an embodiment of the disclosure includes an organic electroluminescent unit. The organic electroluminescent unit includes a plurality of organic electroluminescent elements. One or more of the organic electroluminescent elements include a first reflective layer, a second reflective layer, an organic light-emitting layer, an electrode layer, a film thickness adjusting layer, and a wiring layer. The organic light-emitting layer is provided between the first reflective layer and the second reflective layer, and emits monochromatic light. The electrode layer is provided between the organic light-emitting layer and the second reflective layer, and has a film thickness smaller than a film thickness of the second reflective layer. The film thickness adjusting layer is provided between the electrode layer and the second reflective layer, and has a resistance higher than a resistance of the electrode layer. The wiring layer supplies an electric current between the first reflective layer and the electrode layer.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the disclosure.

DETAILED DESCRIPTION

Figure 1:
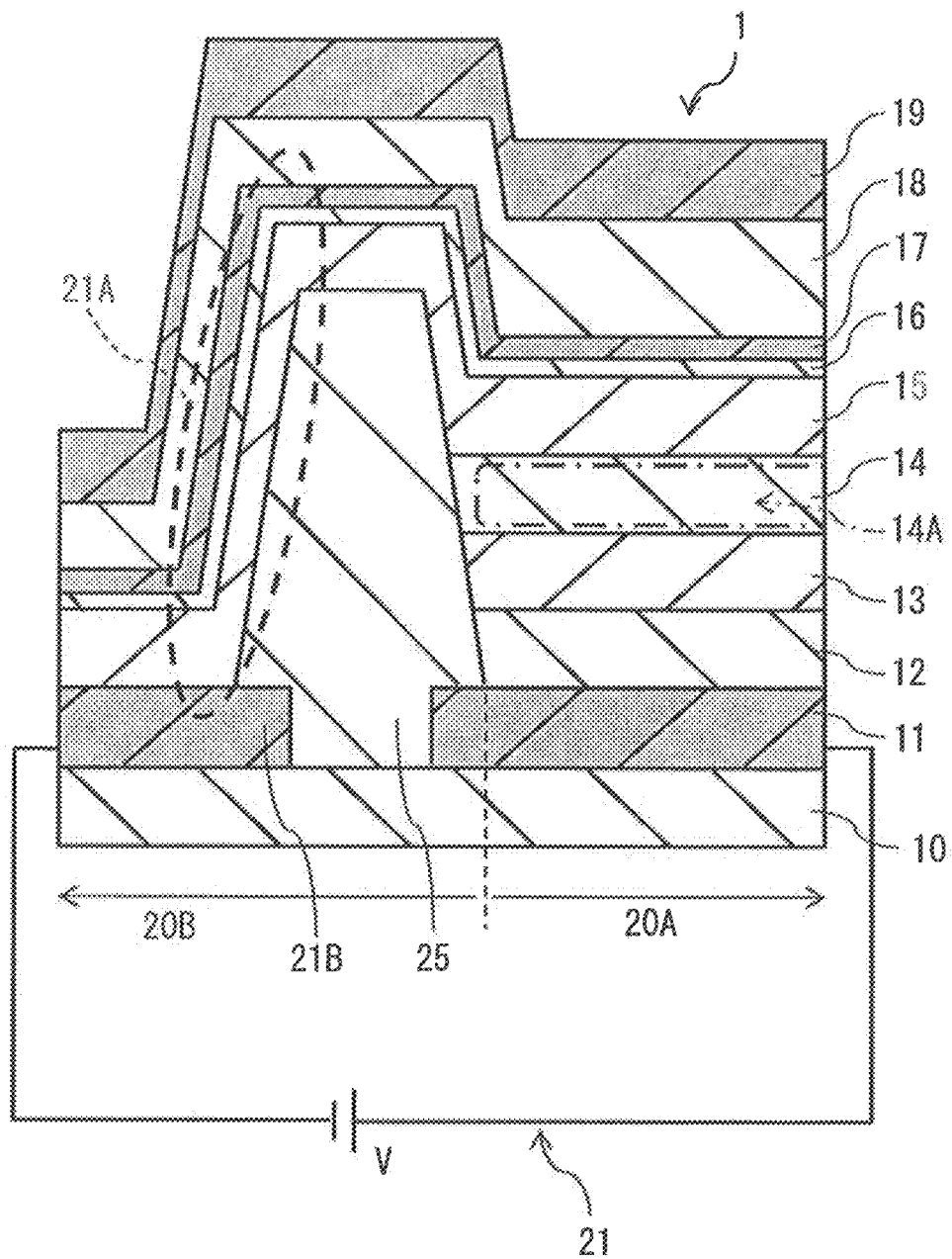
FIG. 1 illustrates an exemplary cross-sectional configuration of an organic electroluminescent element according to one embodiment of the disclosure.

In the following, some example embodiments of the disclosure are described in detail with reference to the accompanying drawings. Note that the following description is directed to illustrative examples of the disclosure and not to be construed as limiting to the disclosure. Factors including, without limitation, numerical values, shapes, materials, components, positions of the components, and how the components are coupled to each other are illustrative only and not to be construed as limiting to the disclosure. Further, elements in the following example embodiments which are not recited in a most-generic independent claim of the disclosure are optional and may be provided on an as-needed basis. The drawings are schematic and are not intended to be drawn to scale. Note that the like elements are denoted with the same reference numerals, and any redundant description thereof will not be described in detail. Note that the description is given in the following order.

1. First Embodiment (Organic Electroluminescent Element)
2. Modification Example of First Embodiment (Organic Electroluminescent Element)
3. Second Embodiment (Organic Electroluminescent Unit)
4. Application Examples (Electronic Apparatus and Illumination Apparatus)

1. FIRST EMBODIMENT

[Configuration]

FIG. 1 illustrates an exemplary cross-sectional configuration of an organic electroluminescent element 1 according to a first embodiment of the disclosure. The organic electroluminescent element 1 may be on a substrate 10, for example. The organic electroluminescent element 1 may have an element structure that includes, for example, a reflective layer 11 (i.e., an anode), a hole injection layer 12, a hole transport layer 13, an organic light-emitting layer 14, an electron transport layer 15, an electron injection layer 16, a cathode 17, a film thickness adjusting layer 18, and a reflective layer 19, in this order from side of the substrate 10. The reflective layer 11, the electron injection layer 16, the cathode 17, and the reflective layer 19 correspond, respectively, to specific but non-limiting examples of a "first reflective layer", an "ytterbium electron injection layer", a "silver electrode layer", and a "second reflective layer" according to one embodiment of the disclosure. The hole injection layer 12 and the hole transport layer 13 may be provided on hole-injection side of the organic light-emitting layer 14. The electron transport layer 15 and the electron injection layer 16 may be provided on electron-injection side of the organic light-emitting layer 14. The organic light-emitting layer 14 is provided between the reflective layer 11 and the reflective layer 19, and emits monochromatic light. The cathode 17 may be an electrode layer provided between the organic light-emitting layer 14 and the reflective layer 19. The electron injection layer 16 may be in contact with the cathode 17 on side of the organic light-emitting layer 14. The film thickness adjusting layer 18 may be provided between the cathode 17 and the reflective layer 19.

Figure 2:
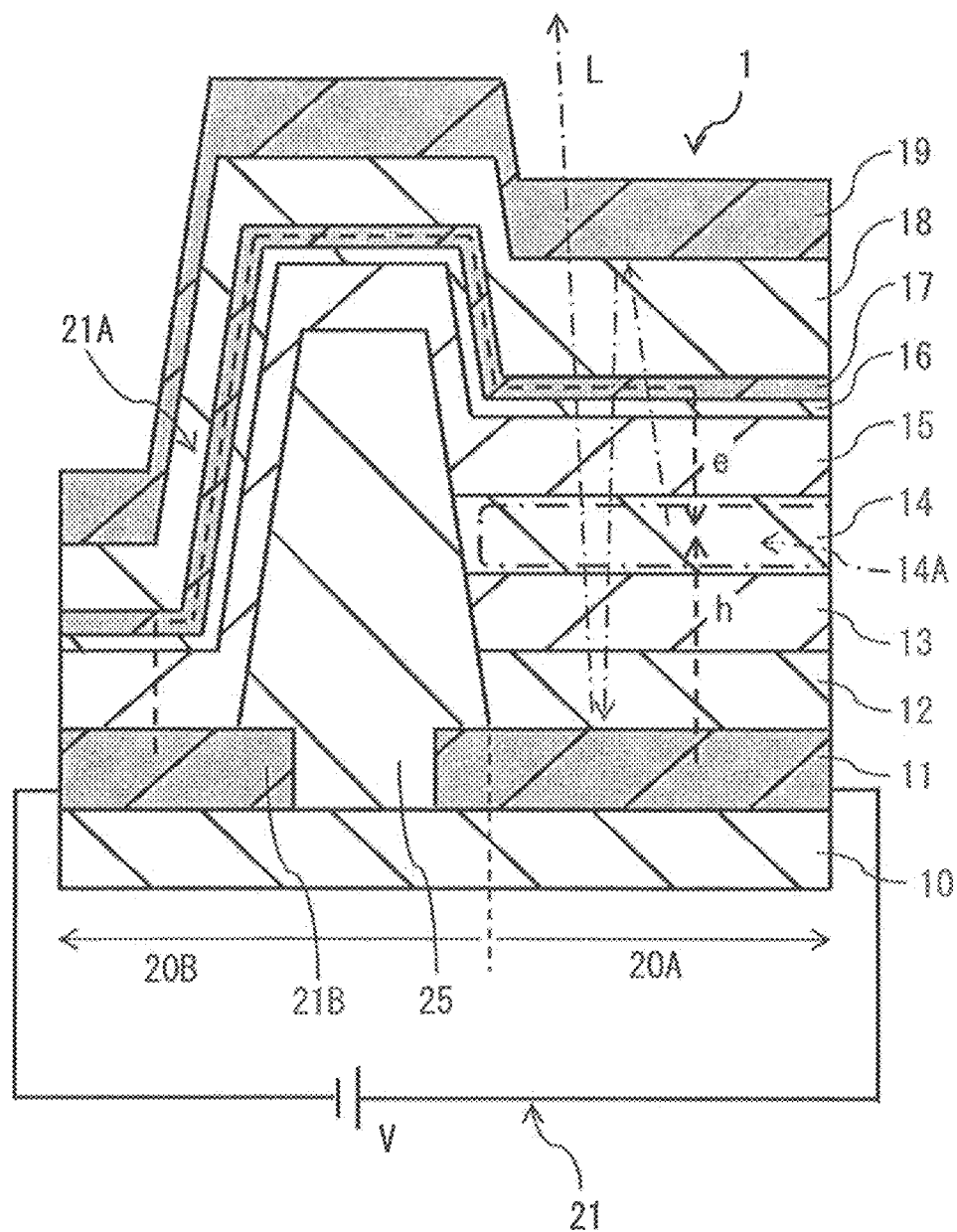
FIG. 2 illustrates an exemplary current and an exemplary optical path.

In the present example embodiment, the organic electroluminescent element 1 may have a microcavity structure. The microcavity structure may have, for example, an effect of strengthening light of a specific wavelength by utilizing light resonance generated between the reflective layer 11 and the reflective layer 19. Light outputted by the organic light-emitting layer 14 is subjected to multiple reflection between the reflective layer 11 and the reflective layer 19. At this occasion, light of a specific wavelength component of the light outputted from the organic light-emitting layer 14 may be strengthened. An optical path length from the reflective layer 11 to the reflective layer 19 corresponds to a light emission spectrum peak wavelength of the light outputted from the organic light-emitting layer 14. The microcavity structure may allow the light outputted from the organic light-emitting layer 14 to repeat reflection within a range of a predetermined optical length between the reflective layer 11 and the reflective layer 19, for example, as illustrated in FIG. 2. This may strengthen, by resonance, light L of a specific wavelength corresponding to the optical path length, while weakening light of a wavelength not corresponding to the optical path length. As a result, a spectrum of the light L to be extracted to the outside may be steep and its intensity may be high, thus causing luminance and color purity thereof to be enhanced. Accordingly, a distance from the reflective layer 11 to the reflective layer 19 may be an optical path length in which the cavity is generated. In the microcavity structure, as a film thickness becomes larger, for example, a primary interference (i.e., a first cavity), a secondary interference (i.e., a second cavity), and a tertiary interference (i.e., a third cavity) may occur.

The substrate 10 may be, for example, a light-transmissive translucent substrate such as a transparent substrate. The substrate 10 may be, for example but not limited to, a glass substrate. Non-limiting examples of a material to be used for the substrate 10 may include non-alkali glass, soda glass, non-fluorescent glass, phosphate glass, borate glass, and quartz. Note that the substrate 10 is not limited to the glass substrate, but may be a translucent resin substrate or a thin-film transistor (TFT) substrate that is to be a backplane of an organic electroluminescent (EL) display unit. Non-limiting examples of a material of the translucent resin substrate to be used for the substrate 10 may include acrylic resin, styrene resin, polycarbonate resin, epoxy resin, polyethylene, polyester, and silicone resin. The substrate 10 may be a highly flexible substrate or a highly rigid substrate with almost no flexibility.

The reflective layer 11 may be on the substrate 10, for example. The reflective layer 11 may be a reflective electrode having reflectivity (e.g., a reflective metal layer). Non-limiting examples of a material of the reflective electrode may include aluminum (Al), silver (Ag), and an alloy of aluminum or silver. The reflective layer 11 may be used as an anode. The reflective layer 11 may be an Ag electrode layer configured by Ag or an Ag alloy having high reflectivity.

The hole injection layer 12 may serve to inject, to the hole transport layer 13 and the organic light-emitting layer 14, holes injected from the reflective layer 11 (i.e., anode). The hole injection layer 12 may be configured by an inorganic material having a hole injection property, for example. Non-limiting examples of the inorganic material having a hole injection property may include oxides (i.e., inorganic oxides) of silver (Ag), molybdenum (Mo), chromium (Cr), vanadium (V), tungsten (W), nickel (Ni), and iridium (Ir). The hole injection layer 12 may be configured by a vapor-deposited film or a sputtered film of the inorganic oxide, for example. Note that the hole injection layer 12 may be configured by an organic material having a hole injection property. Non-limiting examples of the organic material having a hole injection property may include an electrically-conductive polymer material such as a mixture of polythiophene and polystyrene sulfonate (PEDOT). The hole injection layer 12 may be configured by a coated film of the organic material, for example. The hole injection layer 12 may be configured by a vapor-deposited film of the organic material.

The hole transport layer 13 may serve to transport, to the organic light-emitting layer 14, holes injected from the reflective layer 11. The hole transport layer 13 may be configured by, for example, a material (i.e., a hole transporting material) that serves to transport, to the organic light-emitting layer 14, holes injected from the reflective layer 11. Non-limiting examples of the hole transporting material may include an arylamine derivative, a triazole derivative, an oxadiazole derivative, an imidazole derivative, a polyarylalkane derivative, a pyrazoline derivative, a pyrazolone derivative, a phenylenediamine derivative, an amino-substituted chalcone derivative, an oxazole derivative, a styrylanthracene derivative, a fluorenone derivative, a hydrazone derivative, a stilbene derivative, a butadiene compound, a polystyrene derivative, a triphenylmethane derivative, a tetraphenylbenzene derivative, and a combination thereof.

The organic light-emitting layer 14 may serve to emit light of a predetermined color (e.g., monochromatic light) through recombination of holes and electrons. The organic light-emitting layer 14 may include an organic light-emitting material that emits light through generation of excitons caused by recombination of holes and electrons. For example, the organic light-emitting layer 14 may be a coated film that is coated with a solution by application and drying of the solution. The solution may mainly contain the above-described organic light-emitting material as a solute. The organic light-emitting layer 14 may be configured by a vapor-deposited film.

The organic light-emitting layer 14 may be, for example, configured by a single-layered light-emitting layer or a laminate of a plurality of organic light-emitting layers. In a case where the organic light-emitting layer 14 is configured by the laminate of the plurality of organic light-emitting layers, the plurality of organic light-emitting layers may include a common main component of the above-described organic light-emitting material, for example.

The organic light-emitting material that is the (raw) material of the organic light-emitting layer 14 may be, for example but not limited to, a combination of a host material and a dopant material. The organic light-emitting material that is the (raw) material of the organic light-emitting layer 14 may be a single dopant material. The host material may mainly serve to transport charges such as electrons and holes, and the dopant material may serve to emit light. The organic light-emitting material is not only limited to a combination of one host material and one dopant material, but may also be a combination of two or more host materials and two or more dopant materials.

Non-limiting examples of the host material of the organic light-emitting layer 14 may include an amine compound, a condensed polycyclic aromatic compound, and a heterocyclic compound. Non-limiting examples of the amine compound may include a monoamine derivative, a diamine derivative, a triamine derivative, and a tetraamine derivative. Non-limiting examples of the condensed polycyclic aromatic compound may include an anthracene derivative, a naphthalene derivative, a naphthacene derivative, a phenanthrene derivative, a chrysene derivative, a fluoranthene derivative, a triphenylene derivative, a pentacene derivative, and a perylene derivative. Non-limiting examples of the heterocyclic compound may include a carbazole derivative, a furan derivative, a pyridine derivative, a pyrimidine derivative, a triazine derivative, an imidazole derivative, a pyrazole derivative, a triazole derivative, an oxazole derivative, an oxadiazole derivative, a pyrrole derivative, an indole derivative, an azaindole derivative, an azacarbazole derivative, a pyrazoline derivative, a pyrazolone derivative, and a phthalocyanine derivative.

Non-limiting examples of the dopant material of the organic light-emitting layer 14 may include a pyrene derivative, a fluoranthene derivative, an arylacetylene derivative, a fluorene derivative, a perylene derivative, an oxadiazole derivative, an anthracene derivative, and a chrysene derivative. Further, a metal complex may be used as a fluorescent dopant material of the organic light-emitting layer 14. The metal complex may contain, for example, a ligand and an atom of metal, such as iridium (Ir), platinum (Pt), osmium (Os), gold (Au), rhenium (Re), or ruthenium (Ru).

The electron transport layer 15 may serve to transport, to the organic light-emitting layer 14, electrons injected from the cathode 17. The electron transport layer 15 may include, for example, a material (i.e., an electron transporting material) that serves to transport, to the organic light-emitting layer 14, electrons injected from the cathode 17. The electron transport layer 15 may be configured by a vapor-deposited film or a sputtered film, for example. The above-described electron transporting material may be, for example, an aromatic heterocyclic compound containing one or more hetero atoms in a molecule. Non-limiting examples of the aromatic heterocyclic compound may include a compound containing, as a skeleton, a pyridine ring, a pyrimidine ring, a triazine ring, a benzimidazole ring, a phenanthroline ring, and a quinazoline ring. The electron transporting material may be doped with metal having an electron transporting property in some cases. In such cases, the electron transport layer 15 may be an organic electron transport layer that contains a doped metal. The metal with the electron transporting property contained in the electron transport layer 15 makes it possible to enhance the electron transporting property of the electron transport layer 15. Non-limiting examples of the doped metal contained in the electron transport layer 15 may include transition metal such as ytterbium (Yb).

The electron injection layer 16 may serve to inject, to the electron transport layer 15 and the organic light-emitting layer 14, electrons injected from the cathode 17. The electron injection layer 16 may be configured, for example, by a material (i.e., an electron injecting material) that serves to facilitate the injection of electrons to the electron transport layer 15 and the organic light-emitting layer 14 from the cathode 17. Non-limiting examples of the above-described electron injecting material may include ytterbium (Yb). The electron injection layer 16 may be, for example, but not limited to, a Yb layer configured by Yb. The doped metal contained in the electron transport layer 15 may be the same metal as that of the above-described electron injecting material. The electron injection layer 16 may have a film thickness in a range from 0.1 nm to 5 nm, for example. When the electron injection layer 16 has a thickness that is too small, the function of facilitating the electron injection may be lowered. Meanwhile, when the electron injection layer 16 has a thickness that is too large, transmittance may be lowered, thus causing light emission characteristics to be lowered in some cases. Further, the Yb layer may serve to enhance quality of a film of the cathode 17 (Ag) formed in contact with side of the cathode 17 and thus to lower a sheet resistance. As a result, it becomes possible to improve device characteristics without impairing current-carrying stability even in the cathode 17 (Ag) having a small film thickness.

The cathode 17 may be a transparent electrode having translucency (e.g., a translucent metal layer). Non-limiting examples of a material of the transparent electrode may include aluminum (Al), magnesium (Mg), silver (Ag), an aluminum-lithium alloy, and a magnesium-silver alloy. The cathode 17 that serves as the transparent electrode may be, for example, an Al layer, an Mg layer, an Ag layer, an Al—Li alloy layer, or an Mg—Ag alloy layer having a thickness in a range from 0.1 nm to 10 nm. In the present example embodiment, in a case where the substrate 10 and the reflective layer 11 each have reflectivity and the cathode 17 and the reflective layer 19 each have translucency, the organic electroluminescent element 1 may have a top emission structure in which light is outputted from side of the reflective layer 19.

When the cathode 17 has an increased film thickness, a cavity effect provided by reflection at the cathode 17 may be strengthened, causing front luminance to be higher and thus to lower viewing angle characteristics. When the cathode 17 has a smaller film thickness, the cavity effect provided by the cathode 17 may be decreased, causing the front luminance to be suppressed and thus to enhance the viewing angle characteristics. Because of generation of the cavity effect also in the reflective layer 19, increasing the film thickness of the cathode 17 to strengthen reflectivity causes the cavity effect to be complicated. A variation in the light emission characteristics is also increased with respect to a shift in finished film thickness from the design of a film configuration. In addition, the increased variation in the light emission characteristics also causes higher possibility of uneven light emission.

Accordingly, in the present example embodiment, for example, the cathode 17 may have a film thickness smaller than that of the reflective layer 19. In an example embodiment, for example, the reflective layer 19 may have a film thickness in a range from 5 nm to 30 nm. In an example embodiment, the cathode 17 may have a film thickness smaller than that of the reflective layer 19, and may be in a range from 0.1 nm to 10 nm. Further, in an example embodiment, the cathode 17 may have a film thickness smaller than that of the reflective layer 19, and may be in a range from 0.1 nm to 5 nm. Such a configuration makes it possible to suppress the reflection at the cathode 17 and thus to cause the cathode 17 to hardly serve as a reflective layer of the cavity, which makes it possible to suppress the lowering of the device characteristics due to the lowered viewing angle characteristics and due to the shift in the film thickness.

Meanwhile, when the cathode 17 is thinned, the sheet resistance may be deteriorated. In other words, it may be necessary to have a structure that makes the cathode 17 as thin as possible and inhibits the sheet resistance from being higher. Thus, in the present example embodiment, the cathode 17 may be the Ag layer, for example, and the electron injection layer 16 may be the Yb layer, for example. Forming the cathode 17 on the electron injection layer 16 made of Yb makes it possible to achieve reduction in the sheet resistance, thus allowing for improvement in the device characteristics without impairing the current-carrying stability despite the thinned cathode 17.

The film thickness adjusting layer 18 may adjust, for example, the distance from the reflective layer 11 to the reflective layer 19 to a predetermined optical path length. The film thickness adjusting layer 18 may be configured, for example, by a transparent electrically-conductive material such as indium tin oxide (ITO) and indium zinc oxide (IZO). The film thickness adjusting layer 18 may be an ITO layer or an IZO layer, for example. The ITO layer or the IZO layer used for the film thickness adjusting layer 18 may have a film thickness of more than 40 nm, for example. The film thickness adjusting layer 18 may have a resistance higher than that of the cathode 17, and may be designed not to constitute an electric current path. The film thickness adjusting layer 18 may be a metal-undoped organic layer, or may be a metal-doped organic layer. The film thickness adjusting layer 18 may adopt various configurations, unless the film thickness adjusting layer 18 constitutes an electric current path in the organic electroluminescent element 1.

The reflective layer 19 may be a transparent electrode having translucency (e.g., the translucent metal layer). Non-limiting examples of a material of the transparent electrode may include aluminum (Al), magnesium (Mg), silver (Ag), an aluminum-lithium alloy, and a magnesium-silver alloy. The reflective layer 19 that serves as the transparent electrode may be, for example, an Al layer, an Mg layer, an Ag layer, an Al—Li alloy layer, or an Mg—Ag alloy layer having a thickness in a range from 5 nm to 30 nm.

In a case where the organic electroluminescent element 1 is formed as a pixel of a display panel, the organic electroluminescent element 1 may include, on the substrate 10, a plurality of banks 25 that each separate pixels of the display panel. The bank 25 may be configured by an insulating organic material, for example. Non-limiting examples of the insulating organic material may include acrylic resin, polyimide resin, and novolak-type phenol resin. In an example embodiment, the bank 25 may be configured by an insulating resin having heat resistance and resistance to a solvent, for example. The bank 25 may be configured, for example, by fabricating the insulating resin to have a desired pattern by means of photolithography and development. The bank 25 may have, for example, a forward tapered cross-sectional shape as illustrated in FIG. 1, or an inverse tapered cross-sectional shape in which the bottom is narrowed.

The organic electroluminescent element 1 may include a wiring line 21 that performs electrical conduction between the reflective layer 11 (i.e., the anode) and the cathode 17. The wiring line 21 may supply an electric current between the reflective layer 11 (i.e., the anode) and the cathode 17. FIG. 1 illustrates a part extending beyond the bank 25, i.e., a part surrounded by a broken line in FIG. 1 (hereinafter, referred to as a "wiring layer 21A"), out of the cathode 17, the electron injection layer 16, and the electron transport layer 15. FIG. 1 also illustrates an electrode layer 21B formed in a peripheral region 20B that surrounds a pixel region 20A. FIG. 1 exemplifies a state where the wiring layer 21A and the electrode layer 21B constitute a portion of the wiring line 21 that supplies an electric current between the reflective layer 11 (i.e., the anode) and the cathode 17. The wiring layer 21A and the electrode layer 21B may be each provided in a peripheral region (i.e., the peripheral region 20B) of the pixel region 20A. The electrode layer 21B may be provided in the same layer as the reflective layer 11, for example. The electrode layer 21B may be configured by a material common to the reflective layer 11, for example. The pixel region 20A may include a region, of the organic electroluminescent element 1, that faces a region that emits light (i.e., a light-emitting region 14A) by means of injection of an electric current performed by the reflective layer 11 and the cathode 17. The light-emitting region 14A may be generated in the organic light-emitting layer 14 by means of the injection of an electric current performed by the reflective layer 11 and the cathode 17. In a case where a periphery of the reflective layer 11 is surrounded by the bank 25, the light-emitting region 14A may be substantially generated in a region, of the organic light-emitting layer 14, that faces a location at which the reflective layer 11 and the hole injection layer 12 are in direct contact with each other in an opening formed by the bank 25.

Figure 3:
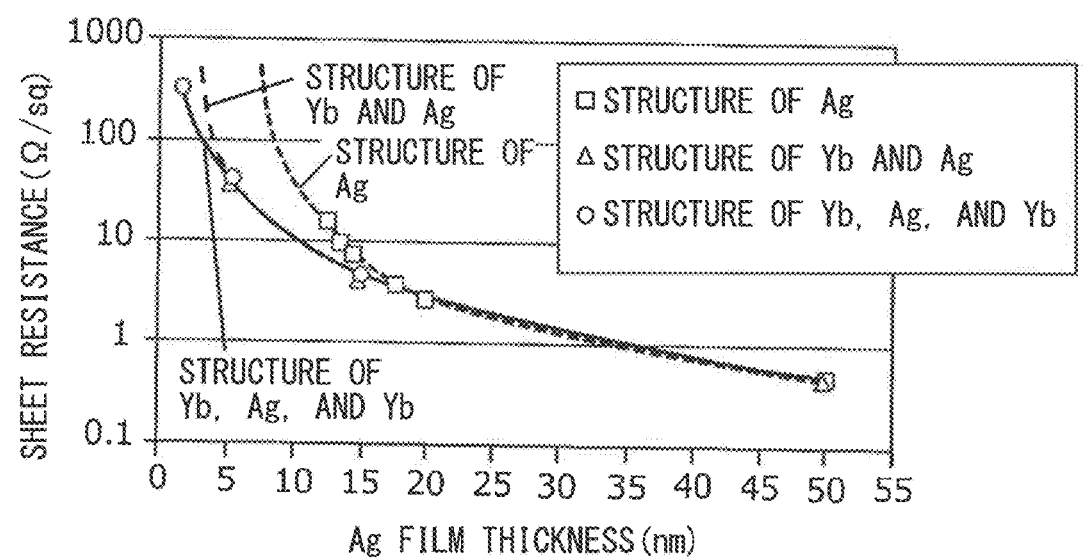
FIG. 3 illustrates an exemplary relation between an Ag film thickness and a sheet resistance.

FIG. 3 illustrates an exemplary relation between an Ag film thickness and a sheet resistance. In the present example embodiment, the cathode 17 may be the Ag layer, for example, and the electron injection layer 16 may be the Yb layer, for example. At this occasion, by allowing the cathode 17 (i.e., the Ag layer) to have a thickness of 20 nm or less and the electron injection layer 16 (i.e., the Yb layer) to have a thickness in a range from 0.1 nm to 5 nm, a structure of the electron injection layer 16 (i.e., the Yb layer) and the cathode 17 (i.e., the Ag layer) may have a sheet resistance value that is smaller than a sheet resistance value of the single Ag layer, as illustrated in FIG. 3. In a case where the cathode 17 (i.e., the Ag layer) has a thickness of about 5 mm, the structure of the electron injection layer 16 (i.e., the Yb layer) and the cathode 17 (i.e., the Ag layer) may have a sheet resistance value of about 20 ohms/sq to about 30 ohms/sq, as illustrated in FIG. 3. Accordingly, by allowing the cathode 17 (i.e., the Ag layer) to have a thickness in a range from 5 nm to 20 nm and the electron injection layer 16 (i.e., the Yb layer) to have a thickness in a range from 0.1 nm to 5 nm, it becomes possible to achieve the cathode 17 having a low resistance. As a result, it becomes possible to improve the device characteristics without impairing the current-carrying stability even in the cathode 17 (Ag) having a small film thickness.

Figure 4:
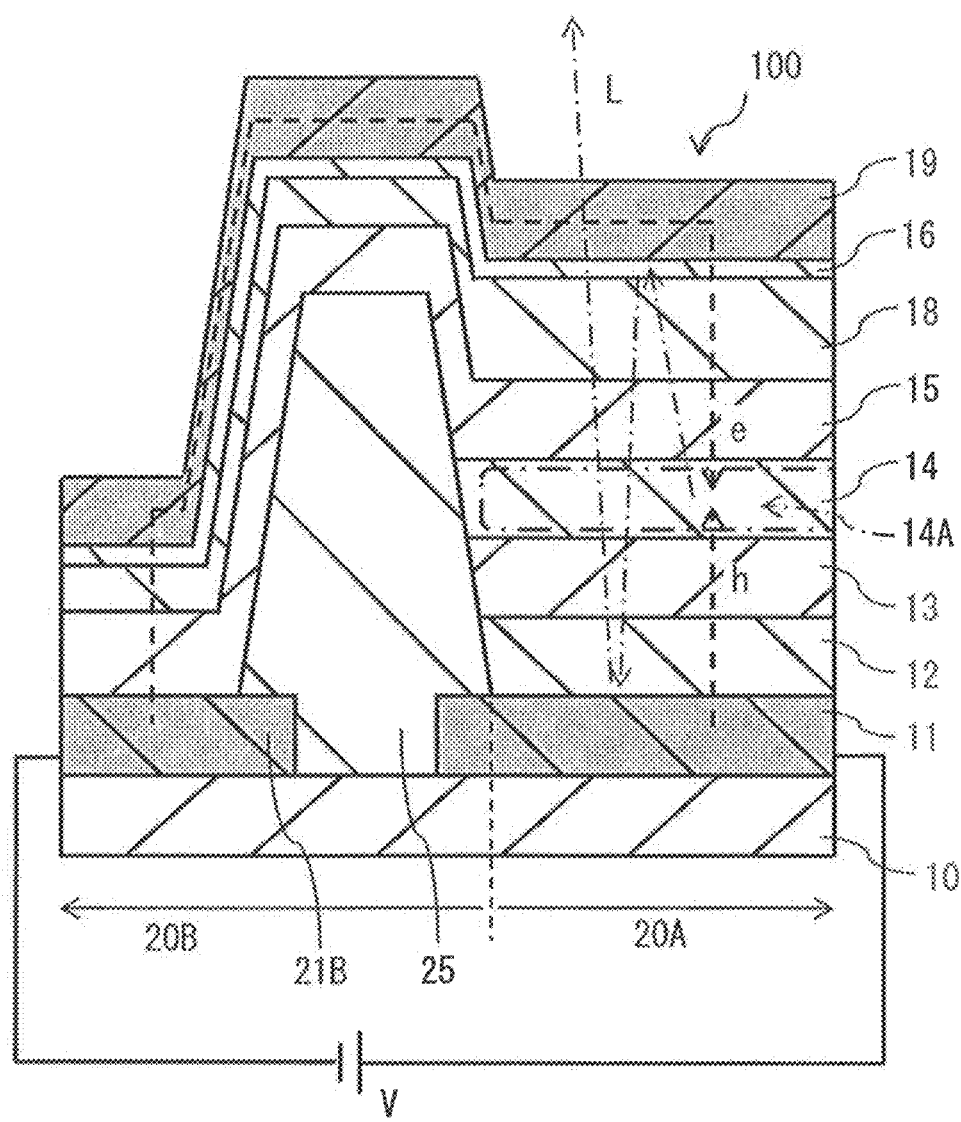
FIG. 4 illustrates an exemplary cross-sectional configuration of an organic electroluminescent element according to a comparative example.

Description is given next of effects of the organic electroluminescent element 1 according to the present example embodiment, with reference also to a comparative example. FIG. 4 illustrates an exemplary cross-sectional configuration of an organic electroluminescent element 100 according to a comparative example. The organic electroluminescent element 100 corresponds to the organic electroluminescent element 1 according to the present example embodiment in which the cathode 17 is omitted and the film thickness adjusting layer 18 is configured by a metal-doped organic layer. In the comparative example, the reflective layer 19 performs the function of the cathode 17. In the comparative example, the electron injection layer 16 is provided between the film thickness adjusting layer 18 and the reflective layer 19, because the reflective layer 19 performs the function of the cathode 17.

The organic electroluminescent element 100 has a microcavity structure similar to that of the organic electroluminescent element 1 according to the present example embodiment. In this microcavity structure, holes (h) travel from the reflective layer 11, through the hole injection layer 12 and the hole transport layer 13, toward the organic light-emitting layer 14. Meanwhile, electrons (e), in the peripheral region 20B, travel from the electrode layer 21B, through the electron transport layer 15, the film thickness adjusting layer 18, the electron injection layer 16, and the reflective layer 19, and enter the pixel region 20A. In the pixel region 20A, the electrons (e) pass through the electron injection layer 16, the film thickness adjusting layer 18, and the electron transport layer 15, toward the organic light-emitting layer 14. Thereafter, the holes (h) and the electrons (e) recombine in the organic light-emitting layer 14 to cause light emission. When the light emission occurs, doped metal is degraded over time in the film thickness adjusting layer 18 configured by the metal-doped organic layer, thus causing the film thickness adjusting layer 18 to have a higher resistance. As a result, a voltage to be applied to the organic electroluminescent element 100 becomes higher. In addition, the doped metal inside the film thickness adjusting layer 18 is diffused as far as the organic light-emitting layer 14, thus causing light extinction as well as deterioration in the light emission characteristics. As described above, the organic electroluminescent element 100 impairs the current-carrying stability and deteriorates the device characteristics.

Meanwhile, in the present example embodiment, there may be provided, between the reflective layer 11 (i.e., the anode) and the reflective layer 19, a laminated body in which the electron injection layer 16 (e.g., the Yb electron injection layer) and the cathode 17 (e.g., the Ag electrode layer) are laminated in contact with each other in this order from the side of the organic light-emitting layer 14. In this structure, holes (h) travel from the reflective layer 11, through the hole injection layer 12 and the hole transport layer 13, toward the organic light-emitting layer 14. Meanwhile, electrons (e), in the peripheral region 20B, travel from the electrode layer 21B, through the electron transport layer 15, the electron injection layer 16, and the cathode 17, and enter the pixel region 20A. In the pixel region 20A, the electrons (e) pass through the electron injection layer 16 and the electron transport layer 15 toward the organic light-emitting layer 14. Thereafter, the holes (h) and the electrons (e) recombine in the organic light-emitting layer 14 to cause light emission. In other words, in this structure, there is no electric current flow to the film thickness adjusting layer 18. That is, doped metal is degraded over time, and thus there is almost no possibility that the film thickness adjusting layer 18 may have a higher resistance. This makes it possible to improve the device characteristics without impairing the current-carrying stability.

Further, in the present example embodiment, the cathode 17 (e.g., the Ag electrode layer) may be thinner than the reflective layer 19. This makes it possible to achieve the cathode 17 having a low resistance and to cause each of the cathode 17 and the electron injection layer 16 to hardly function as the reflective layer of the cavity. As a result, it becomes possible to improve the device characteristics without impairing the current-carrying stability.

Furthermore, in the present example embodiment, there may be provided, between the cathode 17 (e.g., the Ag electrode layer) and the reflective layer 19, the film thickness adjusting layer 18 having a resistance higher than that of the cathode 17 (e.g., the Ag electrode layer). This causes the film thickness adjusting layer 18 not to constitute an electric current path. Accordingly, even in a case where the metal-doped organic layer configures the film thickness adjusting layer 18, there is almost no influence caused by the configuration. In the first place, there may be no electric current flow to the film thickness adjusting layer 18, and thus there may be no diffusion of doped metal to the film thickness adjusting layer 18. As a result, it becomes possible to improve the device characteristics without impairing the current-carrying stability.

2. MODIFICATION EXAMPLE OF FIRST EMBODIMENT

Modification Example A

Figure 5:
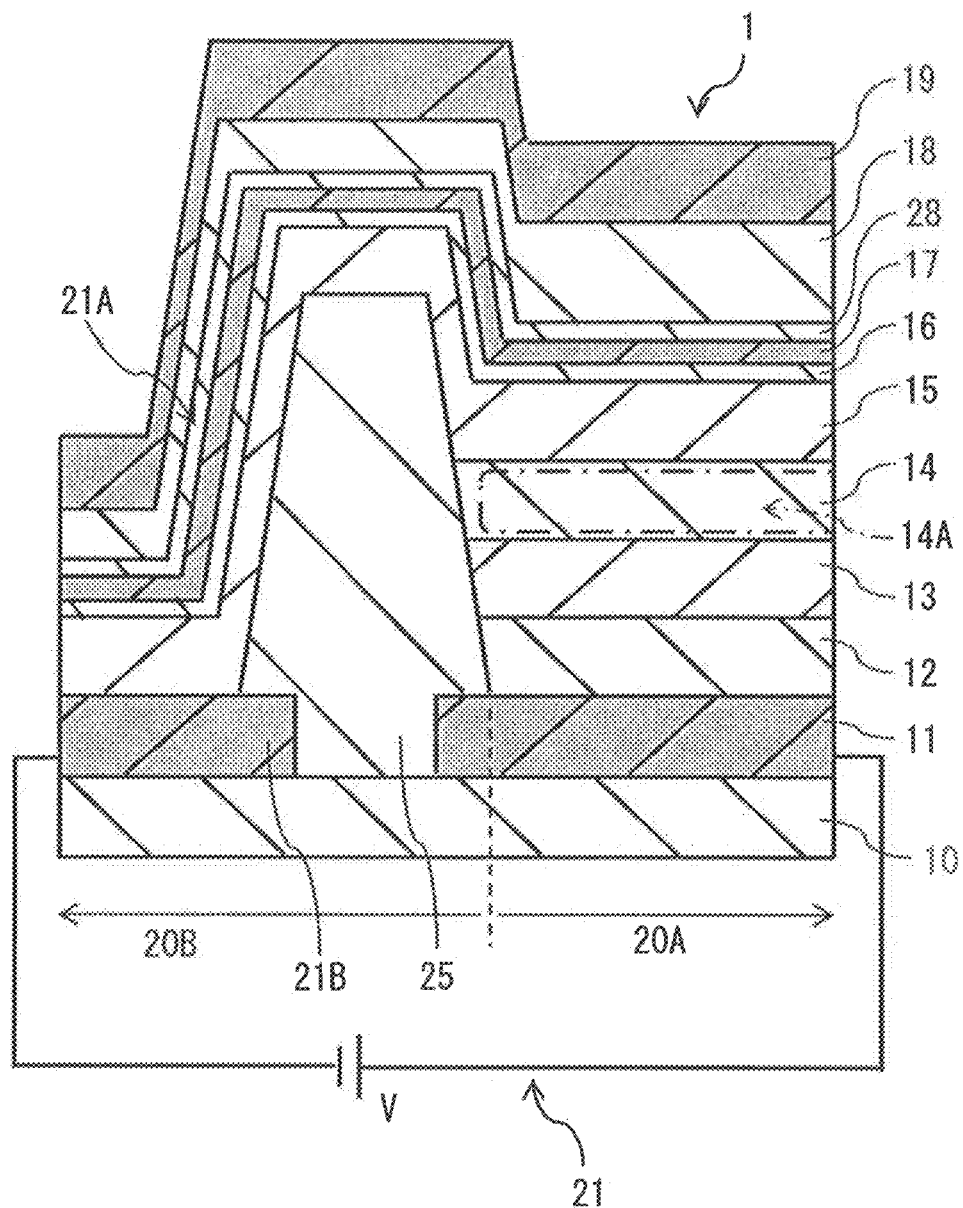
FIG. 5 illustrates an exemplary cross-sectional configuration of an organic electroluminescent element according to a modification example.

In the foregoing example embodiment, for example, there may be provided a protective layer 28 that is in contact with the cathode 17 (e.g., the Ag electrode layer) on the side of the reflective layer 19, as illustrated in FIG. 5. The protective layer 28 corresponds to a specific but non-limiting example of an "ytterbium protective layer" according to one embodiment of the disclosure. The protective layer 28 may serve as a low resistance layer that lowers a resistance value when the cathode 17 (e.g., the Ag electrode layer) is very thin. The protective layer 28 may be the Yb layer having a thickness in a range from 0.1 nm to 5 nm, for example. The protective layer 28 may have a resistance lower than that of the film thickness adjusting layer 18.

Figures 6, 7:
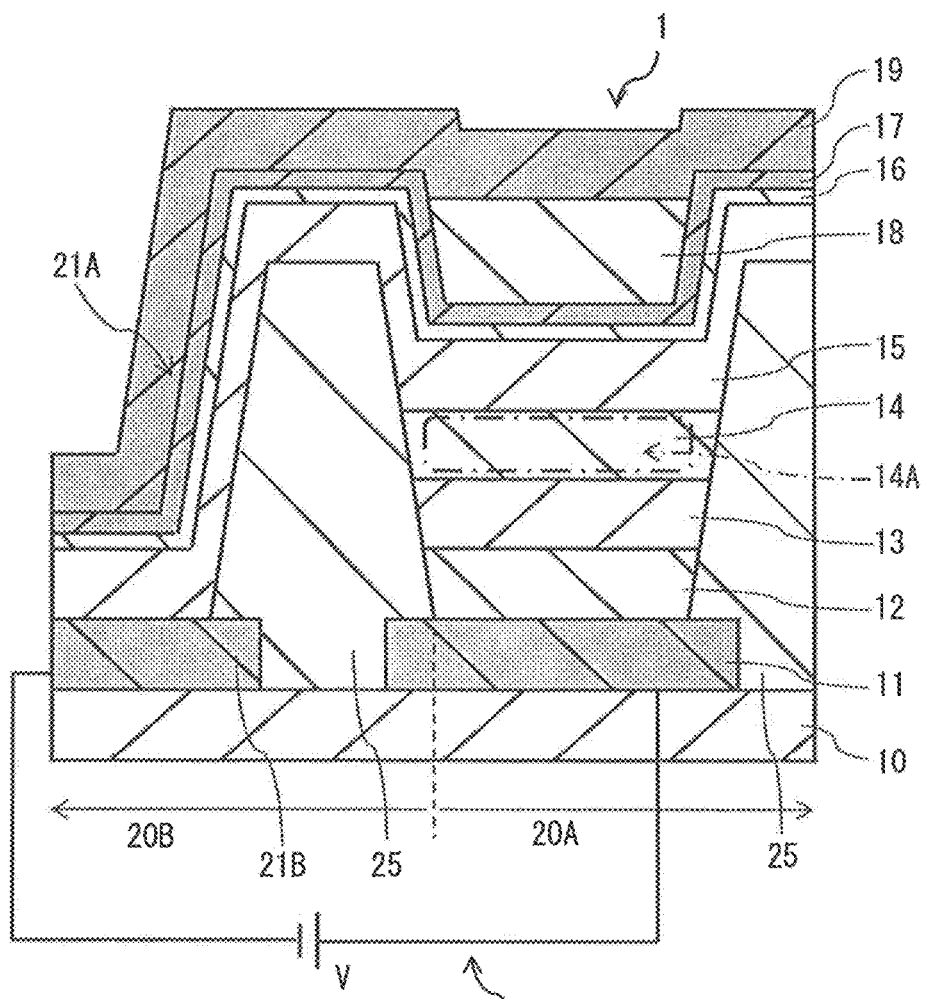
FIG. 6 illustrates an exemplary relation between an Ag film thickness and a sheet resistance, a Yb electron injection layer, and a Yb protective layer.
FIG. 7 illustrates an exemplary cross-sectional configuration of an organic electroluminescent element according to a modification example.

FIG. 6 illustrates an exemplary relation between an Ag film thickness and a sheet resistance, a Yb electron injection layer, and a Yb protective layer. In FIG. 6, the cathode 17 may be the Ag layer, for example, and the electron injection layer 16 may be the Yb layer, for example. When the Ag layer has a film thickness of 5 nm, in a case where the electron injection layer 16 made of Yb is not provided (comparative example), the sheet resistance value is significantly increased to reach 10 Mohms/sq or more. Meanwhile, in a case where the electron injection layer 16 made of Yb is provided (working example), it is possible to achieve a low resistance cathode having a sheet resistance value in a range from about 20 ohms/sq to about 30 ohms/sq. Further, when the Ag layer has a film thickness of 2 nm, in each of a case where the electron injection layer 16 made of Yb is not provided (comparative example) and a case where the protective layer 28 made of Yb is not provided even with the provision of the electron injection layer 16 made of Yb (example), the sheet resistance value is significantly increased to reach 10 Mohms/sq or more. Meanwhile, in a case where the electron injection layer 16 made of Yb is provided and the protective layer 28 made of Yb is provided (Modification Example A), it is possible to achieve the cathode 17 having a low resistance in a range from about 350 ohms/sq to about 400 ohms/sq. As described above, in the present modification example, the provision of the protective layer 28 (e.g., the Yb protective layer) in contact with the cathode 17 (e.g., the Ag electrode layer) on the side of the reflective layer 19 makes it possible to achieve the cathode 17 having a low resistance. As a result, it becomes possible to improve the device characteristics without impairing the current-carrying stability even in the cathode 17 (e.g., the Ag electrode layer) having a small film thickness.

Modification Example B

Figure 8:
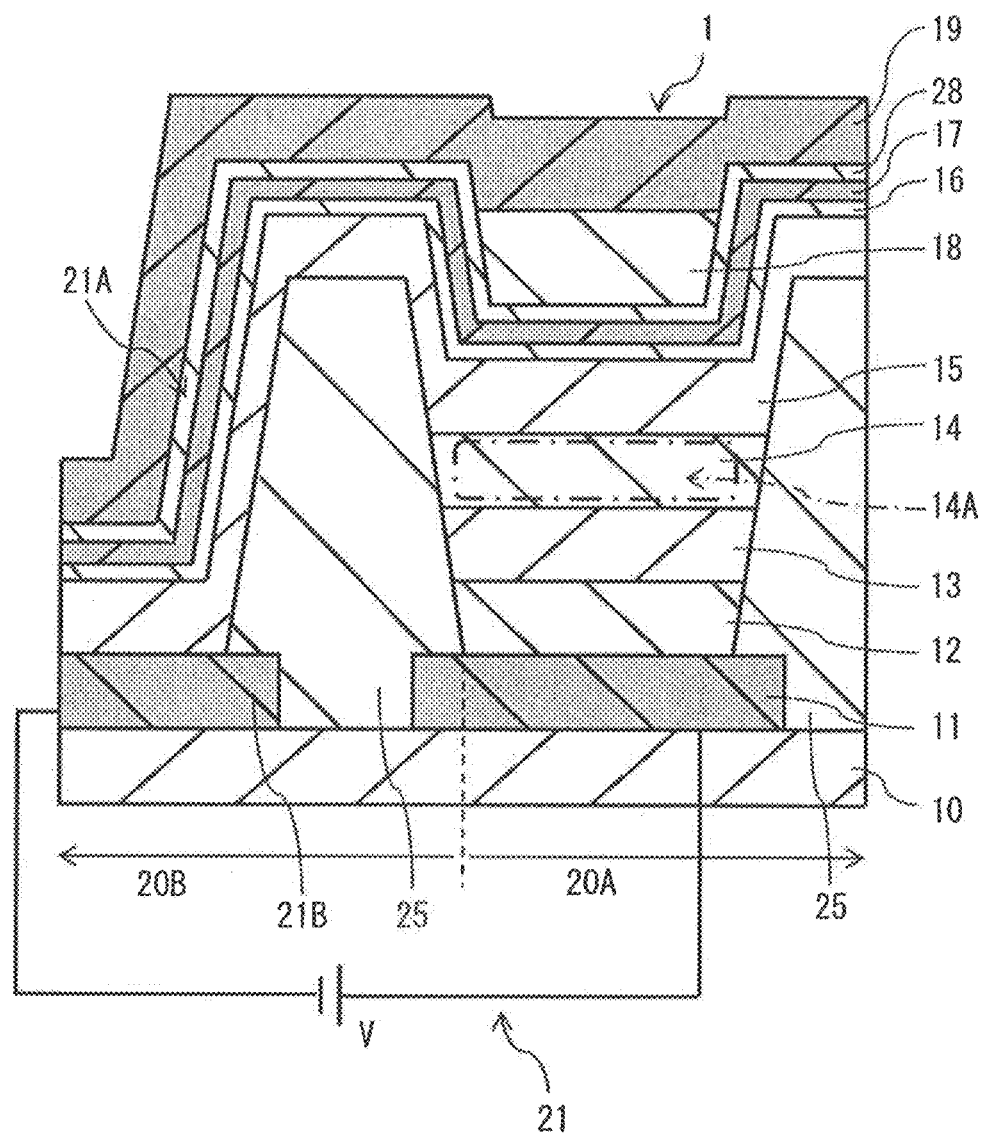
FIG. 8 illustrates an exemplary cross-sectional configuration of an organic electroluminescent element according to a modification example.

Further, in the foregoing example embodiment and Modification Example A, the reflective layer 19 and the cathode 17 (e.g., the Ag electrode layer) may be in electrical conduction with each other, for example, as illustrated in FIGS. 7 and 8. Furthermore, in the foregoing example embodiment, the reflective layer 19 may be in contact with a portion of the cathode 17 (e.g., the Ag electrode layer). In a specific but non-limiting example, in the foregoing example embodiment, the reflective layer 19 and the cathode 17 (e.g., the Ag electrode layer) may be in electrical conduction with each other in a region not facing the light-emitting region 14A of the organic light-emitting layer 14 in a thickness direction. The region not facing the light-emitting region 14A may be, for example, a region facing the bank 25 in the thickness direction, or the peripheral region 20B. As described above, the electrical conduction between the reflective layer 19 and the cathode 17 (e.g., the Ag electrode layer) allows the reflective layer 19 having a low resistance to perform a role of an auxiliary wiring line. This makes it possible to reduce an influence due to the resistance, and thus to reduce a phenomenon (i.e., voltage drop) in which a voltage is less likely to be applied to a middle part of a large-sized panel. Further, in the configuration in which the film thickness adjusting layer 18 having a resistance higher than that of the cathode 17 (e.g., the Ag electrode layer) is provided between the cathode 17 (e.g., the Ag electrode layer) and the reflective layer 19, the film thickness adjusting layer 18 does not constitute an electric current path. Accordingly, even in a case where the metal-doped organic layer configures the film thickness adjusting layer 18, there is almost no influence caused by the configuration. In the first place, there may be no electric current flow to the film thickness adjusting layer 18, and thus there may be no diffusion of doped metal to the film thickness adjusting layer 18. As a result, it becomes possible to improve the device characteristics without impairing the current-carrying stability.

Modification Example C

Figure 9:
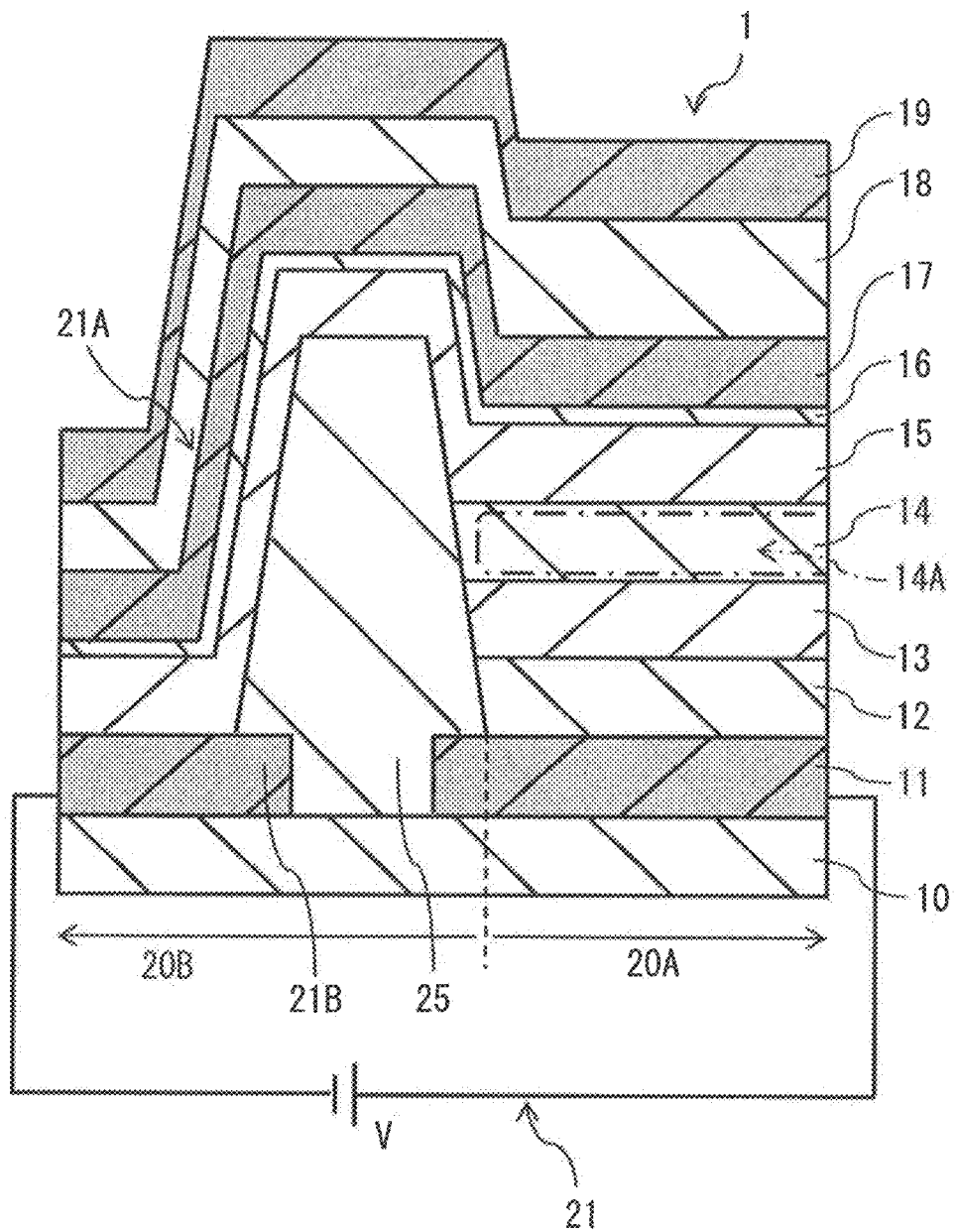
FIG. 9 illustrates an exemplary cross-sectional configuration of an organic electroluminescent element according to a modification example.

Further, in the foregoing example embodiment and Modification Examples A and B, as long as it is possible to control lowering in transmittance due to increased film thickness of the cathode 17 or to control a variation in the light emission characteristics with respect to the shift in the film thickness, the cathode 17 may have a film thickness that is equal to or larger than that of the reflective layer 19, for example, as illustrated in FIG. 9. In this case, it is possible to lower the sheet resistance of the cathode 17, and thus to improve the device characteristics.

Modification Example D

Figure 10:
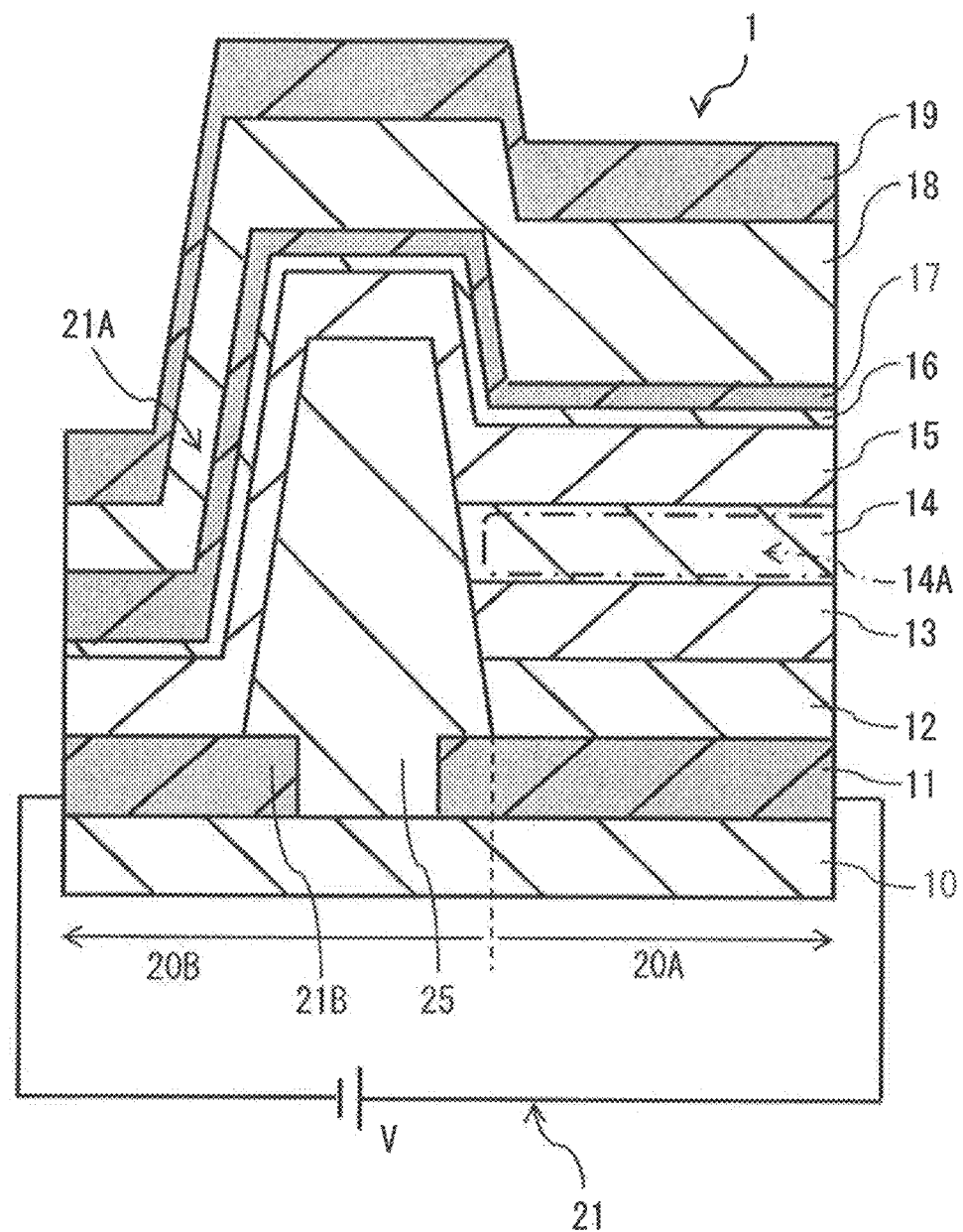
FIG. 10 illustrates an exemplary cross-sectional configuration of an organic electroluminescent element according to a modification example.

Further, in the foregoing example embodiment and Modification Examples A and B, for example, the cathode 17 may have a thickness that is relatively small in the pixel region 20A and is relatively large in the peripheral region (i.e., the peripheral region 20B) of the pixel region 20A, as illustrated in FIG. 10. In this case, it is possible to reduce the voltage drop in the peripheral region 20B, and thus to improve the device characteristics.

3. SECOND EMBODIMENT

[Configuration]

Figure 11:
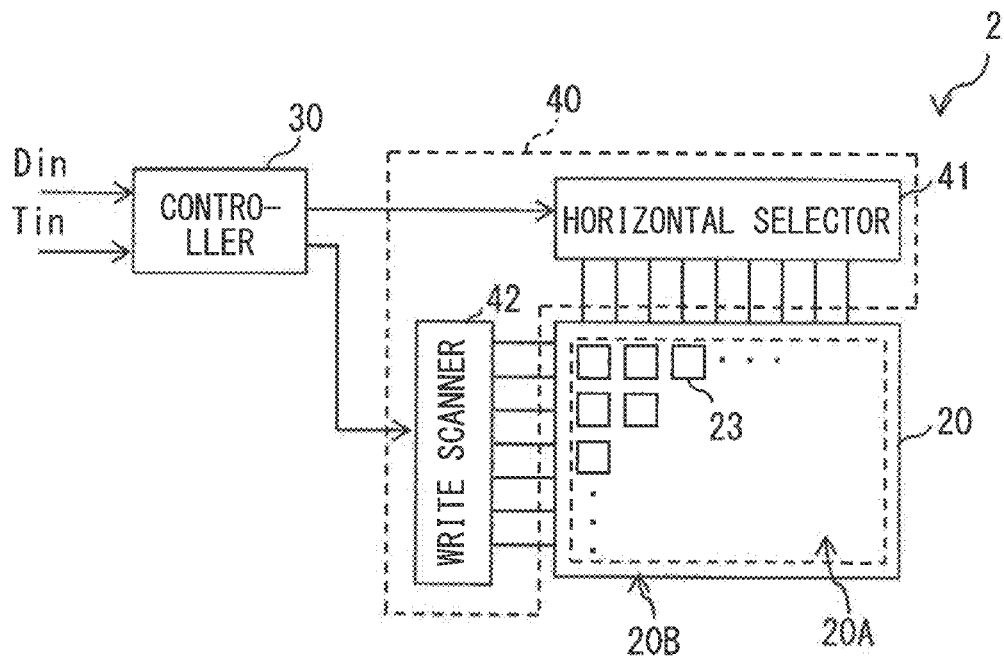
FIG. 11 illustrates an exemplary outline configuration of an organic electroluminescent unit according to one embodiment of the disclosure.
Figure 12:
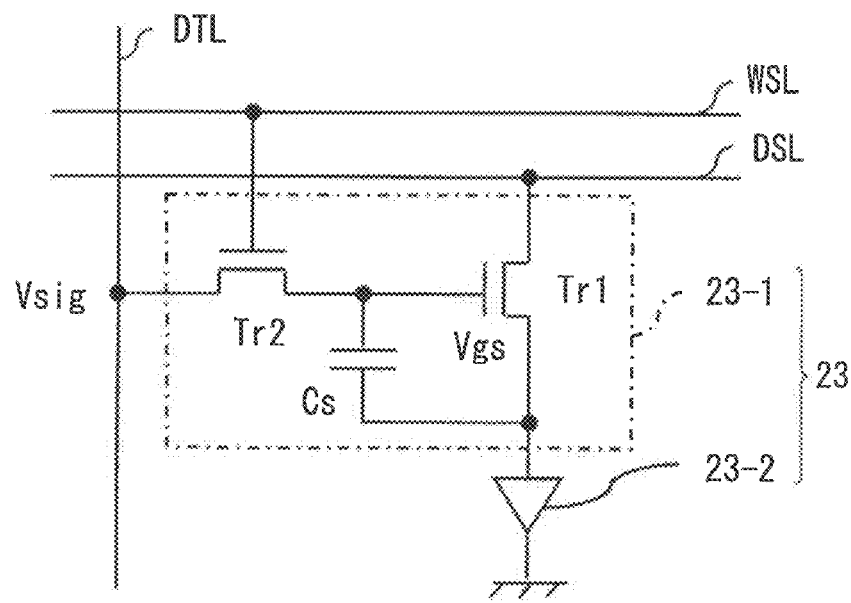
FIG. 12 illustrates an exemplary circuit configuration of a pixel illustrated in FIG. 11.

FIG. 11 illustrates an exemplary outline configuration of an organic electroluminescent unit 2 according to a second embodiment of the disclosure. FIG. 12 illustrates an exemplary circuit configuration of a pixel 23 in the organic electroluminescent unit 2. The organic electroluminescent unit 2 may include, for example, a display panel 20, a controller 30, and a driver 40. The display panel 20 may include a plurality of pixels 23 arranged in matrix in the pixel region 20A. The driver 40 may be mounted on an outer edge portion (i.e., the peripheral region 20B that is a peripheral region of the pixel region 20A) of the display panel 20. The controller 30 and the driver 40 may drive the display panel 20 on the basis of an image signal Din and a synchronizing signal Tin received from an external device.

[Display Panel 20]

In response to active-matrix driving of the pixels 23 performed by the controller 30 and the driver 40, the display panel 20 may display an image based on the image signal Din and the synchronizing signal Tin received from the external device. The display panel 20 may include a plurality of scanning lines WSL and a plurality of power lines DSL both extending in a row direction, a plurality of signal lines DTL extending in a column direction, and the plurality of pixels 23 arranged in matrix.

The scanning lines WSL may be used to select the pixels 23. The scanning lines WSL may supply a selection pulse to the pixels 23 to select the pixels 23 on a predetermined unit basis. For example, the pixels 23 may be selected on a pixel-row basis. The signal lines DTL may supply, to each of the pixels 23, a signal voltage Vsig corresponding to the image signal Din. The signal lines DTL may supply, to each of the pixels 23, a data pulse including the signal voltage Vsig. The power lines DSL may supply electric power to the pixels 23.

The plurality of pixels 23 may include ones emitting red light, ones emitting green light, and ones emitting blue light, for example. Note that the pixels 23 may further include ones emitting light of another color, such as white or yellow.

The signal lines DTL may be each coupled to an output end of a horizontal selector 41 described later. Each of the signal lines DTL may be assigned to a corresponding pixel column, for example. The scanning lines WSL may be each coupled to an output end of a write scanner 42 described later. Each of the scanning lines WSL may be assigned to a corresponding pixel row, for example. The power lines DSL may be each coupled to an output end of a power supply. Each of the power lines DSL may be assigned to a corresponding pixel row, for example.

The pixels 23 may each include, for example, a pixel circuit 23-1 and an organic electroluminescent element 23-2. The organic electroluminescent element 23-2 may be, for example, the organic electroluminescent element 1 according to any of the foregoing example embodiment and modification examples thereof. One or more of the pixels 23 in the display panel 20 may include the organic electroluminescent element 1 according to any of the foregoing example embodiment and modification examples thereof. In other words, one or more of the organic electroluminescent elements 23-2 in the display panel 20 may be the organic electroluminescent element 1 according to any of the foregoing example embodiment and modification examples thereof.

The pixel circuit 23-1 may control light emission and light extinction of the organic electroluminescent element 23-2. The pixel circuit 23-1 may serve to retain a voltage written into the corresponding pixel 23 through write scanning described later. The pixel circuit 23-1 may include a driving transistor Tr1, a switching transistor Tr2, and a storage capacitor Cs, for example.

The switching transistor Tr2 may control application of the signal voltage Vsig to a gate of the driving transistor Tr1. The signal voltage Vsig may be based on the image signal Din. In a specific but non-limiting example, the switching transistor Tr2 may sample a voltage of the signal line DTL and write the sampled voltage into the gate of the driving transistor Tr1. The driving transistor Tr1 may be coupled in series to the organic electroluminescent element 23-2. The driving transistor Tr1 may drive the organic electroluminescent element 23-2. The driving transistor Tr1 may control an electric current flowing through the organic electroluminescent element 23-2 on the basis of the magnitude of the voltage sampled at the switching transistor Tr2. The storage capacitor Cs may retain a predetermined voltage between the gate and a source of the driving transistor Tr1. The storage capacitor Cs may serve to retain a gate-source voltage Vgs of the driving transistor Tr1 at a constant level for a predetermined period. Note that the pixel circuit 23-1 may have a circuit configuration that includes the 2Tr1C circuit described above and additional capacitors and transistors. In an alternative embodiment, the pixel circuit 23-1 may have a circuit configuration different from that of the 2Tr1C circuit described above.

Each of the signal lines DTL may be coupled to an output end of the horizontal selector 41 described later and a source or a drain of the switching transistor Tr2. Each of the scanning lines WSL may be coupled to an output end of the write scanner 42 described later and a gate of the switching transistor Tr2. Each of the power lines DSL may be coupled to an output end of a power supply circuit 33 and the source or a drain of the driving transistor Tr1.

The gate of the switching transistor Tr2 may be coupled to the corresponding scanning line WSL. One of the source and the drain of the switching transistor Tr2 may be coupled to the corresponding signal line DTL. A terminal of the source and the drain of the switching transistor Tr2, which is not coupled to the signal line DTL, may be coupled to the gate of the driving transistor Tr1. One of the source and the drain of the driving transistor Tr1 may be coupled to the corresponding power line DSL. A terminal of the source and the drain of the driving transistor Tr1, which is not coupled to the power line DSL, may be coupled to the anode (i.e., the reflective layer 11) of the organic electroluminescent element 23-2. One end of the storage capacitor Cs may be coupled to the gate of the driving transistor Tr1. The other end of the storage capacitor Cs may be coupled to a terminal, on side of the organic electroluminescent element 23-2, of the source and the drain of the driving transistor Tr1.

[Driver 40]

The driver 40 may include the horizontal selector 41 and the write scanner 42, for example. The horizontal selector 41 may apply the analog signal voltage Vsig to each of the signal lines DTL, in response to or in synchronization with an input of a control signal, for example. The analog signal voltage Vsig may be transmitted from the controller 30. The write scanner 42 may scan the pixels 23 on a predetermined unit basis.

[Controller 30]

Description is given next of the controller 30. The controller 30 may perform predetermined correction on the digital image signal Din and generate the signal voltage Vsig on the basis of the image signal obtained through the predetermined correction, for example. The image signal Din may be transmitted from an external device, for example. The controller 30 may output the generated signal voltage Vsig to the horizontal selector 41, for example. The controller 30 may transmit a control signal to each circuit in the driver 40, in response to or in synchronization with the synchronizing signal Tin. The synchronizing signal may be transmitted from an external device, for example.

Figure 13:
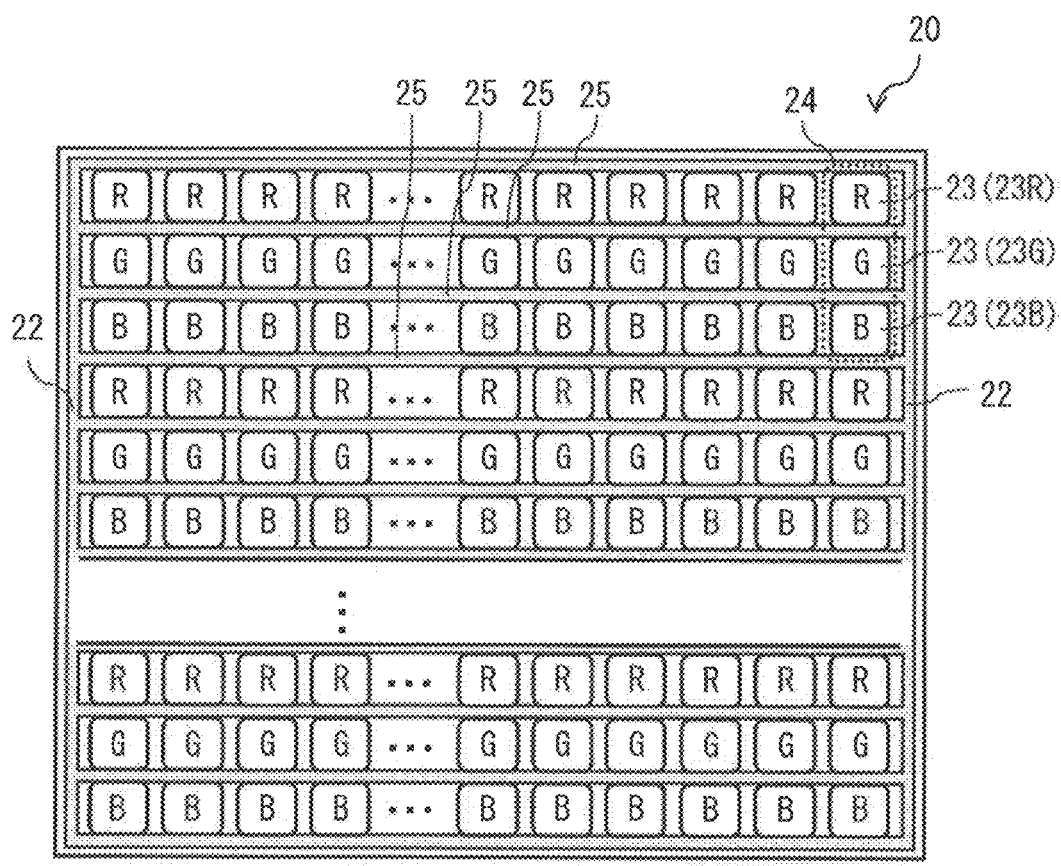
FIG. 13 is a plan view of an exemplary outline configuration of a display panel illustrated in FIG. 11.

Description is given next of the organic electroluminescent element 23-2, with reference to figures such as FIGS. 13 and 1. FIG. 13 illustrates an exemplary outline configuration of the display panel 20.

The display panel 20 may include the plurality of pixels 23 arranged in matrix. As described above, for example, the plurality of pixels 23 may include a pixel 23 (23R) that emits red light, a pixel 23 (23G) that emits green light, and a pixel 23 (23B) that emits blue light. In the plurality of pixels 23, for example, the pixel 23R, the pixel 23G, and the pixel 23B may configure a pixel (i.e., a color pixel 24) in color display.

The pixel 23R may include the organic electroluminescent element 23-2 that emits red light. The pixel 23G may include the organic electroluminescent element 23-2 that emits green light. The pixel 23B may include the organic electroluminescent element 23-2 that emits blue light. The pixels 23R, 23G, and 23B may be arranged in a stripe shape, for example. In the pixels 23, for example, the pixels 23R, 23G, and 23B may be arranged in line in a column direction. Further, in each pixel row, for example, the plurality of pixels that emit light of the same color are arranged alongside in the row direction.

The display panel 20 may include, on the substrate 10, the plurality of banks 25 extending in the row direction and two banks 22 extending in the column direction. Each of the plurality of banks 25 corresponds to the bank 25 in the foregoing first embodiment. The plurality of banks 25 and the two banks 22 may separate the pixel regions 20A of the display panel 20. The plurality of banks 25 may separate the pixels 23 in each color pixel 24. The two banks 22 may define ends of each of the pixel rows. In other words, each of the pixel rows may be separated by two banks 25 and the two banks 22.

[Effects]

In one embodiment of the disclosure, one or more of the organic electroluminescent elements 23-2 in the display panel 20 may be the organic electroluminescent element 1 according to any of the foregoing example embodiment and modification examples thereof. Hence, it is possible to achieve the organic electroluminescent unit 2 that is superior in the light emission characteristics and has a long service life.

4. APPLICATION EXAMPLES

Application Example 1

Described later is an application example of the organic electroluminescent unit 2 of the foregoing second embodiment. The organic electroluminescent unit 2 is applicable to a variety of display units of electronic apparatuses that display, as images or pictures, image signals received from external devices or generated inside the display units. Non-limiting examples of the electronic apparatuses may include televisions, digital cameras, notebook personal computers, sheet-like personal computers, portable terminal devices such as mobile phones, and video cameras.

Figure 14:
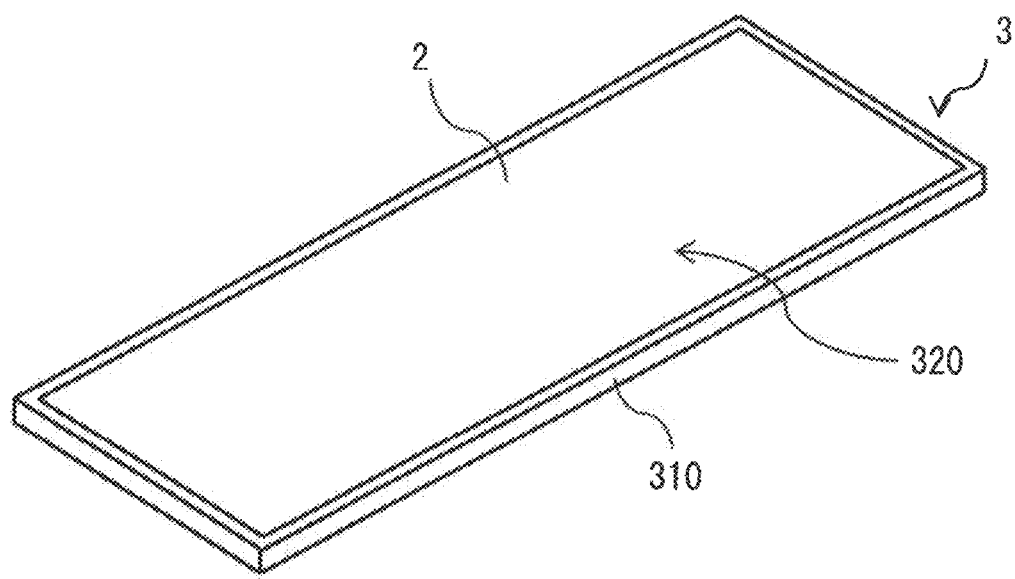
FIG. 14 is a perspective view of an appearance of an electronic apparatus provided with an organic electroluminescent unit according to one embodiment of the disclosure.

FIG. 14 is a perspective view of an appearance of an electronic apparatus 3 of the present application example. The electronic apparatus 3 may be, for example, a sheet-like personal computer including a body 310 having a display surface 320 on a main face. The organic electroluminescent unit 2 may be provided on the display surface 320 of the electronic apparatus 3. The organic electroluminescent unit 2 may be disposed such that the display panel 20 faces outward. In the present application example, the organic electroluminescent unit 2 provided on the display surface 320 makes it possible to achieve the electronic apparatus 3 that is superior in the light emission characteristics and has a long service life.

Application Example 2

Described later is an application example of the organic electroluminescent element 1 according to any of the foregoing example embodiment and modification examples thereof. The organic electroluminescent element 1 is applicable to a variety of light sources for illumination apparatuses, such as illumination apparatuses for table lighting or floor lighting, and illumination apparatuses for room lighting.

Figure 15:
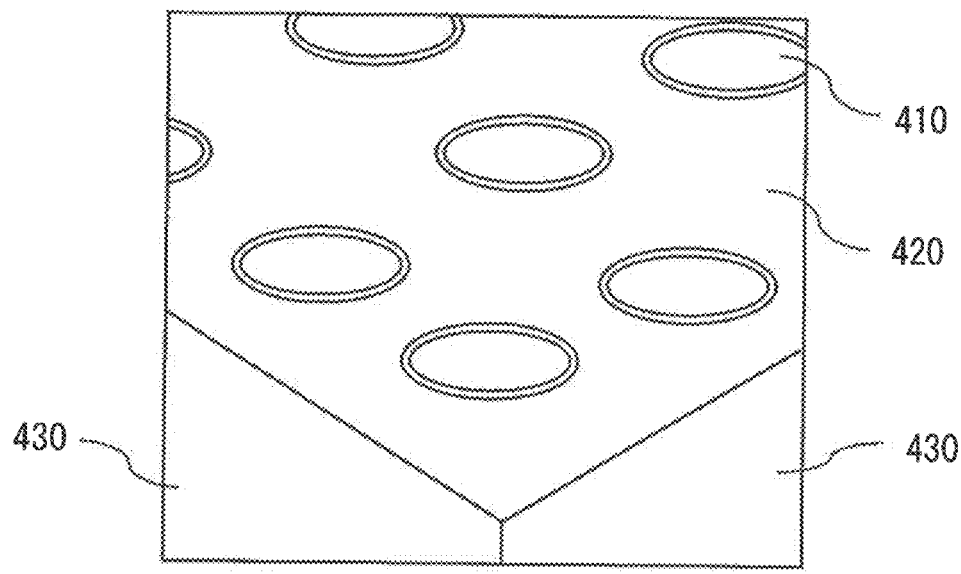
FIG. 15 is a perspective view of an appearance of an illumination apparatus provided with an organic electroluminescent element according to one embodiment of the disclosure.

FIG. 15 illustrates an appearance of an illumination apparatus for room lighting to which the organic electroluminescent element 1 according to any of the foregoing example embodiment and modification examples thereof is applied. The illumination apparatus may include, for example, illuminating sections 410 each including one or a plurality of the organic electroluminescent elements 1 according to any of the foregoing example embodiment and modification examples thereof. An appropriate number of the illuminating sections 410 may be disposed at appropriate intervals on a ceiling 420 of a building. Note that the illuminating sections 410 may be installed on any place other than the ceiling 420, such as a wall 430 or an unillustrated floor, depending on the intended use.

The illumination apparatus may perform illumination with light outputted from the organic electroluminescent elements 1 according to any of the foregoing example embodiment and modification examples thereof. This makes it possible to achieve an illumination apparatus that is superior in the light emission characteristics and has a long service life.

Although the disclosure has been described hereinabove with reference to the example embodiment and the application examples, the disclosure is not limited thereto, but may be modified in a wide variety of ways. Note that the effects described hereinabove are mere examples. The effects according to an embodiment of the disclosure are not limited to those described hereinabove. The disclosure may further include other effects in addition to the effects described hereinabove.

Moreover, the disclosure may have the following configurations, for example.

(1)
An organic electroluminescent element including:
a first reflective layer;
a second reflective layer;
an organic light-emitting layer that is provided between the first reflective layer and the second reflective layer, and emits monochromatic light;
a silver electrode layer provided between the organic light-emitting layer and the second reflective layer; and
an ytterbium electron injection layer that is in contact with the silver electrode layer on side of the organic light-emitting layer.

(2)
The organic electroluminescent element according to (1), further including an ytterbium protective layer that is in contact with the silver electrode layer on side of the second reflective layer.

(3)
The organic electroluminescent element according to (1) or (2), in which the silver electrode layer is thinner than the second reflective layer.

(4)
The organic electroluminescent element according to any one of (1) to (3), further including a film thickness adjusting layer that is provided between the silver electrode layer and the second reflective layer and has a resistance higher than a resistance of the silver electrode layer.

(5)
The organic electroluminescent element according to any one of (1) to (4), further including a wiring line that performs electrical conduction between the first reflective layer and the silver electrode layer and supplies an electric current between the first reflective layer and the silver electrode layer.

(6)
The organic electroluminescent element according to any one of (1) to (5), in which the second reflective layer and the silver electrode layer are in electrical conduction with each other.

(7)
The organic electroluminescent element according to (6), in which the second reflective layer and the silver electrode layer are in electrical conduction with each other in a region not facing a light-emitting region of the organic light-emitting layer.

(8)
The organic electroluminescent element according to any one of (1) to (7), in which a distance from the first reflective layer to the second reflective layer is an optical path length in which a cavity is generated.

(9)
An organic electroluminescent unit including a plurality of organic electroluminescent elements,
one or more of the organic electroluminescent elements including
a first reflective layer,
a second reflective layer,
an organic light-emitting layer that is provided between the first reflective layer and the second reflective layer, and emits monochromatic light,
a silver electrode layer provided between the organic light-emitting layer and the second reflective layer, and
an ytterbium electron injection layer that is in contact with the silver electrode layer on side of the organic light-emitting layer.

(10)
The organic electroluminescent unit according to (9), in which
the organic electroluminescent elements are provided in a pixel region, and
the second reflective layer and the silver electrode layer are in electrical conduction with each other in a peripheral region of the pixel region.

(11)
An electronic apparatus including an organic electroluminescent unit that includes a plurality of organic electroluminescent elements,
one or more of the organic electroluminescent elements including
a first reflective layer,
a second reflective layer,
an organic light-emitting layer that is provided between the first reflective layer and the second reflective layer, and emits monochromatic light,
a silver electrode layer provided between the organic light-emitting layer and the second reflective layer, and
an ytterbium electron injection layer that is in contact with the silver electrode layer on side of the organic light-emitting layer.

(12)
An organic electroluminescent element including:
a first reflective layer;
a second reflective layer;
an organic light-emitting layer that is provided between the first reflective layer and the second reflective layer, and emits monochromatic light;
an electrode layer that is provided between the organic light-emitting layer and the second reflective layer, and has a film thickness smaller than a film thickness of the second reflective layer;
a film thickness adjusting layer that is provided between the electrode layer and the second reflective layer, and has a resistance higher than a resistance of the electrode layer; and
a wiring layer that supplies an electric current between the first reflective layer and the electrode layer.

(13)
The organic electroluminescent element according to (12), in which the second reflective layer and the electrode layer are in electrical conduction with each other in a peripheral region of a pixel region.

(14)
An organic electroluminescent element including:
a first reflective layer;
a second reflective layer;
an organic light-emitting layer that is provided between the first reflective layer and the second reflective layer, and emits monochromatic light;
an electrode layer provided between the organic light-emitting layer and the second reflective layer;
a film thickness adjusting layer that is provided between the electrode layer and the second reflective layer, and has a resistance higher than a resistance of the electrode layer; and a wiring layer that supplies an electric current between the first reflective layer and the electrode layer.

(15)

The organic electroluminescent element according to (14), in which the electrode layer has a film thickness that is relatively small in a pixel region and that is relatively large in a peripheral region of the pixel region.

According to the organic electroluminescent element of one embodiment of the disclosure, and the organic electroluminescent unit and the electronic apparatus each including the organic electroluminescent element, there is provided, between the first reflective layer and the second reflective layer, the laminated body in which the ytterbium electron injection layer and the silver electrode layer are laminated in contact with each other in this order from side of the organic light-emitting layer. Hence, it becomes possible to improve the device characteristics without impairing the current-carrying stability.

According to the organic electroluminescent element of one embodiment of the disclosure, and the organic electroluminescent unit and the electronic apparatus each including the organic electroluminescent element, the electrode layer is provided between the organic light-emitting layer and the second reflective layer, and has a film thickness smaller than that of the second reflective layer; the film thickness adjusting layer is provided between the electrode layer and the second reflective layer, and has a resistance higher than that of the electrode layer; and the wiring layer is provided that supplies an electric current between the first reflective layer and the electrode layer. Hence, it becomes possible to improve the device characteristics without impairing the current-carrying stability. Note that the description hereinabove is merely exemplified. The effects of the disclosure are not limited to those described hereinabove. The disclosure may include some effects different from those described hereinabove and may further include additional effects.

Although the technology has been described in terms of exemplary embodiments, it is not limited thereto. It should be appreciated that variations may be made in the described embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" as used herein can allow for a degree of variability in a value or range. Moreover, no element or component in this disclosure is intended to be dedicated to the public regardless of whether the element or component is explicitly recited in the following claims.

What is claimed is:

1. An organic electroluminescent element comprising:
a first reflective layer;
a second reflective layer;
an organic light-emitting layer that is provided between the first reflective layer and the second reflective layer, and emits monochromatic light;
a silver electrode layer provided between the organic light-emitting layer and the second reflective layer; and
an ytterbium electron injection layer that is in contact with the silver electrode layer on side of the organic light-emitting layer.

2. The organic electroluminescent element according to claim 1, further comprising an ytterbium protective layer that is in contact with the silver electrode layer on side of the second reflective layer.

3. The organic electroluminescent element according to claim 1, wherein the silver electrode layer is thinner than the second reflective layer.

4. The organic electroluminescent element according to claim 1, further comprising a film thickness adjusting layer that is provided between the silver electrode layer and the second reflective layer and has a resistance higher than a resistance of the silver electrode layer.

5. The organic electroluminescent element according to claim 1, further comprising a wiring line that performs electrical conduction between the first reflective layer and the silver electrode layer and supplies an electric current between the first reflective layer and the silver electrode layer.

6. The organic electroluminescent element according to claim 1, wherein the second reflective layer and the silver electrode layer are in electrical conduction with each other.

7. The organic electroluminescent element according to claim 6, wherein the second reflective layer and the silver electrode layer are in electrical conduction with each other in a region not facing a light-emitting region of the organic light-emitting layer.

8. The organic electroluminescent element according to claim 1, wherein a distance from the first reflective layer to the second reflective layer is an optical path length in which a cavity is generated.

9. An organic electroluminescent unit comprising a plurality of organic electroluminescent elements,
one or more of the organic electroluminescent elements including
a first reflective layer,
a second reflective layer,
an organic light-emitting layer that is provided between the first reflective layer and the second reflective layer, and emits monochromatic light,
a silver electrode layer provided between the organic light-emitting layer and the second reflective layer, and
an ytterbium electron injection layer that is in contact with the silver electrode layer on side of the organic light-emitting layer.

10. The organic electroluminescent unit according to claim 9, wherein
the organic electroluminescent elements are provided in a pixel region, and
the second reflective layer and the silver electrode layer are in electrical conduction with each other in a peripheral region of the pixel region.

11. An electronic apparatus comprising an organic electroluminescent unit that includes a plurality of organic electroluminescent elements,
one or more of the organic electroluminescent elements including
a first reflective layer,
a second reflective layer, an organic light-emitting layer that is provided between the first reflective layer and the second reflective layer, and emits monochromatic light, a silver electrode layer provided between the organic light-emitting layer and the second reflective layer, and an ytterbium electron injection layer that is in contact with the silver electrode layer on side of the organic light-emitting layer.

12. An organic electroluminescent element comprising:

a first reflective layer;

a second reflective layer;

an organic light-emitting layer that is provided between the first reflective layer and the second reflective layer, and emits monochromatic light;

an electrode layer that is provided between the organic light-emitting layer and the second reflective layer, and has a film thickness smaller than a film thickness of the second reflective layer;

a film thickness adjusting layer that is provided between the electrode layer and the second reflective layer, and has a resistance higher than a resistance of the electrode layer; and a wiring layer that supplies an electric current between the first reflective layer and the electrode layer.

13. The organic electroluminescent element according to claim 12, wherein the second reflective layer and the electrode layer are in electrical conduction with each other in a peripheral region of a pixel region.

14. An organic electroluminescent element comprising:

a first reflective layer;

a second reflective layer;

an organic light-emitting layer that is provided between the first reflective layer and the second reflective layer, and emits monochromatic light;

an electrode layer provided between the organic light-emitting layer and the second reflective layer;

a film thickness adjusting layer that is provided between the electrode layer and the second reflective layer, and has a resistance higher than a resistance of the electrode layer; and a wiring layer that supplies an electric current between the first reflective layer and the electrode layer.

15. The organic electroluminescent element according to claim 14, wherein the electrode layer has a film thickness that is relatively small in a pixel region and that is relatively large in a peripheral region of the pixel region.

* * * * *